(12) United States Patent
Anderson

(10) Patent No.: US 7,113,891 B2
(45) Date of Patent: Sep. 26, 2006

(54) MULTI-PORT SCATTERING PARAMETER CALIBRATION SYSTEM AND METHOD

(75) Inventor: Keith F. Anderson, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 58 days.

(21) Appl. No.: 10/844,469

(22) Filed: May 12, 2004

(65) Prior Publication Data

US 2005/0256658 A1    Nov. 17, 2005

(51) Int. Cl.
    *G06F 3/02*    (2006.01)
(52) U.S. Cl. ............... 702/186; 702/183; 702/188; 702/196
(58) Field of Classification Search ........... 702/65, 702/85, 117, 150, 182, 186, 188, 196; 324/601; 342/465; 715/716
    See application file for complete search history.

(56) References Cited

U.S. PATENT DOCUMENTS

| | | | | |
|---|---|---|---|---|
| 5,578,932 A | * | 11/1996 | Adamian | 324/601 |
| 5,793,213 A | | 8/1998 | Bockelman et al. | 324/601 |
| 6,147,501 A | * | 11/2000 | Chodora | 324/601 |
| 6,188,968 B1 | * | 2/2001 | Blackham | 702/85 |
| 6,300,775 B1 | * | 10/2001 | Peach et al. | 324/601 |
| 6,826,506 B1 | * | 11/2004 | Adamian et al. | 702/118 |

FOREIGN PATENT DOCUMENTS

WO    WO 00/46605    7/2000

OTHER PUBLICATIONS

Ferrerro, Andrea and Kerwin, Kevin J.; "A New Implementation of a Multiport Automatic Network Analyzer"; IEEE Transactions On Microwave Theory and Techniques, vol. 40, No. 11, Nov. 1992, pp. 2078-2085.

* cited by examiner

*Primary Examiner*—Marc S. Hoff
*Assistant Examiner*—Felix Suarez

(57) ABSTRACT

A system and method for calibrating a multi-port S-parameter measurement device reduces the number of full calibrations necessary to characterize the multi-port S-parameter measurement device by utilizing a reciprocal network concept. The multi-port S-parameter measurement device includes a network analyzer having network ports connected to respective sets of switch ports on a switch. Full calibrations are performed on selected port pairs of the switch to determine the calibration arrays for each of the port pairs. Each port pair includes one switch port from two different sets of switch ports. A switch error having three switch error terms attributable to a reciprocal network introduced by an unselected one of the switch ports not included within any of the one or more port pairs is determined, and the switch error is de-embedded from the calibration arrays to construct a complete set of calibration arrays for all of the measurement paths in the multi-port S-parameter measurement device.

31 Claims, 3 Drawing Sheets

MULTI-PORT SCATTERING PARAMETER CALIBRATION SYSTEM AND METHOD

BACKGROUND OF THE INVENTION

In the RF and microwave frequency ranges (1 MHz to over 40 GHz), devices can be characterized by their scattering (S) parameters. S-parameters provide information on device performance and can be easily measured by commercially available S-parameter measurement devices, also known as network analyzers. Network analyzers can be grouped into two categories: scalar network analyzers (SNAs) and vector network analyzers (VNAs). SNAs measure the amplitudes of the S-parameters, while VNAs measure both the amplitudes and phases of the S-parameters.

In operation, when the ports of a device under test (DUT) are connected to the ports of a network analyzer, the network analyzer applies a signal to each device port in succession and measures the amplitude and the phase (when using a VNA) of the reflected and transmitted waves to determine the S-parameters of the DUT. However, with virtually any network analyzer, there are inevitable hardware imperfections that can produce significant measurement errors if the imperfections are not accounted for in the measurements. The process of characterizing the imperfections in the network analyzer is known as calibration.

The basic premise of calibration is to use a mathematical error model of the network analyzer with a number of unknown error terms to describe all of the main error contributions. In practice, calibration involves connecting certain well-known devices, called standards, to the network analyzer, and using the resulting measurements to mathematically solve for the error terms of the error model. After calibration, the error terms can be removed from the measurement of any DUT to correct for imperfections in the network analyzer.

Most network analyzers are designed to measure the S-parameters of two-port devices, typically with coaxial or waveguide interfaces. However, as technology advances, more complicated DUTs that require multi-port S-parameter characterization are becoming common. To accommodate multi-port DUTs with a two-port network analyzer, the two-port network analyzers are often connected to programmable switch boxes that contain at least as many ports as the number of ports on the DUT. The network analyzer measures the S-parameters of the DUT between two device ports by setting the switch to couple the two switch ports connected to the two device ports to the two network analyzer ports. The remaining switch ports are terminated in the switch box.

However, the addition of a programmable switch box introduces new errors into the measurement system. To remove the switch box errors, each transmission path through the switch box (i.e., each switch port pair) must be calibrated. Thus, with N switch ports, N(N−1)/2 transmission paths must be calibrated. For example, for a 10-port DUT, in one calibration method, 45 separate two-port measurements are required to determine the error terms for the switch box. Calibrating such a large number of transmission paths is time consuming, difficult and cost-prohibitive.

Therefore, what is needed is a calibration system and method that reduces the number of full calibrations necessary to characterize a multi-port S-parameter measurement device.

SUMMARY OF THE INVENTION

Embodiments of the present invention provide a calibration system and method that reduces the number of full two-port calibrations on a multi-port S-parameter measurement device to M/2, where M is the number of network ports of the network analyzer. Each of the network ports on the network analyzer is connected to respective sets of switch ports on the switch. Full calibrations are performed on selected port pairs of the switch to determine the calibration arrays for each of the selected port pairs. Each selected port pair includes one switch port from two different sets of switch ports. A switch error having three switch error terms attributable to a reciprocal network introduced by an unselected one of the switch ports not included within any of the selected port pairs is determined, and the switch error is de-embedded from the previously determined calibration arrays to construct a complete set of calibration arrays for all of the transmission paths in the multi-port S-parameter measurement device.

In one embodiment, the switch error is determined by measuring known open, short and load standards on the unselected port. In another embodiment, the switch error is determined by measuring a thru standard between the unselected port and a selected port corresponding to one of the switch ports in one of the port pairs that is in a different set of switch ports from the unselected port. In a further embodiment, the switch error is determined by measuring a reflect standard on at least the unselected port and measuring a line standard between the unselected port and the selected port.

Advantageously, embodiments of the present invention reduce the number of calibration connections required for calibration of a multi-port S-parameter measurement device, which results in reduced user fatigue, reduced errors, faster calibration and a simplified set of standards. Furthermore, the invention provides embodiments with other features and advantages in addition to or in lieu of those discussed above. Many of these features and advantages are apparent from the description below with reference to the following drawings.

BRIEF DESCRIPTION OF THE DRAWINGS

The disclosed invention will be described with reference to the accompanying drawings, which show important sample embodiments of the invention and which are incorporated in the specification hereof by reference, wherein.

DETAILED DESCRIPTION OF THE EXEMPLARY EMBODIMENTS

Figure 1:
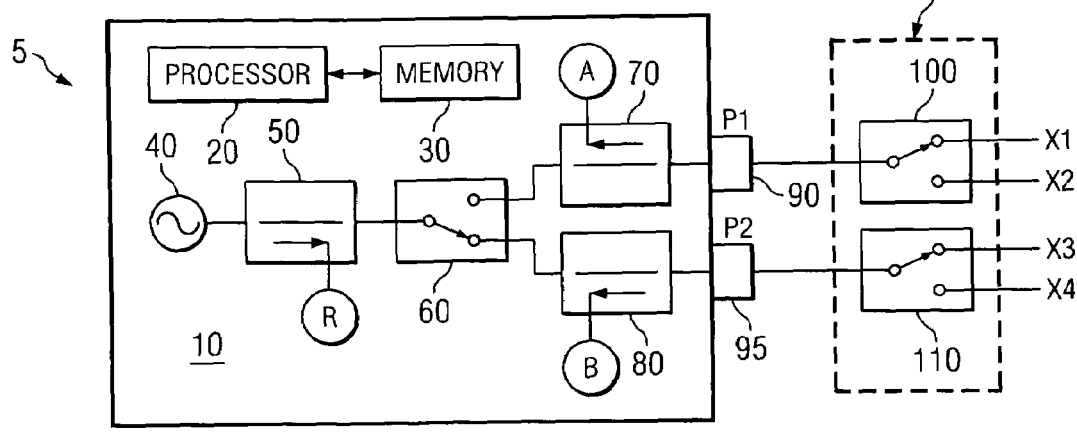
FIG. 1 is a block diagram of an exemplary S-parameter measurement device including an M-port network analyzer connected to an N-port switch, in accordance with embodiments of the present invention.

FIG. 1 is a block diagram of an exemplary S-parameter measurement device 5 that can be calibrated in accordance with embodiments of the present invention. The S-parameter measurement device 5 includes an M-port network analyzer 10 connected to an N-port switch 150. In FIG. 1, network analyzer 10 includes the calibration system of the present invention that is capable of reducing the number of full calibrations required to calibrate the S-parameter measurement device 5 to M/2. However, it should be understood that the calibration system can be implemented wholly or partly on an external computing device, such as a personal computer or server, as described below.

Network analyzer 10 shown in FIG. 1 is a vector network analyzer. However, it should be understood that the present invention is not limited to vector network analyzers, but can be applied to scalar network analyzers and any other type of multi-port S-parameter measurement device. Network analyzer 10 includes a processor 20 connected to a memory medium 30, which together control the operation of the network analyzer 10 and the calibration system of the present invention. Processor 20 can be a microprocessor, microcontroller, programmable logic device or any other processing device. In one embodiment, memory medium 30 includes software programmed to calibrate the S-parameter measurement device 5 that is executable by processor 20. In another embodiment, processor 20 is programmed to calibrate the S-parameter measurement device 5 and memory medium 30 stores calibration measurements and error terms used by processor 20. Memory medium 30 can be any type of computer-readable medium, whether permanent or transportable. For example, memory medium 30 can be a flash ROM, EEPROM, ROM, RAM, hard disk, compact disk, floppy disk, tape drive, optical disk or any other type of storage device.

In a further embodiment, at least a portion of memory medium 30 and/or processor 20 can be located external to network analyzer 10. For example, memory medium 30 and/or processor 20 can be included in a computing device, such as a personal computer or server. The computing device can be either connected to the network analyzer 10 to control the calibration of the network analyzer 10 or receive uploaded calibration measurements taken by the network analyzer 10 from a memory device (permanent or transportable) associated with the network analyzer 10.

Network analyzer 10 further includes a source generator 40, splitter 50, switch 60, couplers 70 and 80 and receivers A, B and R. Receiver A is connected to a first port (P1) 90 and receiver B is connected to a second port (P2) 95. Source generator 40 generates a signal that is transmitted to coupler 50. Coupler 50 splits the signal between receiver R, which measures the incident wave, and switch 60. Switch 60 is set to transmit the signal to either P1 90 or P2 95. When switch 60 is set to transmit the signal to P1 90, receiver A measures the reflected wave from P1 90 and receiver B measures the transmitted wave from P1 90 to P2 95. When switch 60 is set to transmit the signal to P2 95, receiver B measures the reflected wave from P2 95 and receiver A measures the transmitted wave from P2 95 to P1 90.

Switch 150 provides for automatic switching between the two ports (P1 and P2) 90 and 95 of network analyzer 10 and the ports of a device under test (DUT) (not shown). Thus, switch 150 includes N ports, corresponding to at least the number of ports on the DUT. In FIG. 1, switch 150 includes two 1×2 RF switches 100 and 110, each having two ports, illustrated as X1, X2, X3 and X4. Switch ports X1 and X2 are coupled to network port P1 90 and switch ports X3 and X4 are coupled to network port P2 95 through respective connecting devices, such as coaxial cables. It should be understood that switch 150 can be controlled by processor 20 or by an external computing device. It should further be understood that switch 150 can include any number and/or type of RF switches. For example, switch 150 can include a crossbar RF switch or any number of 1×N switches.

Traditionally, the number of full calibrations required to characterize the S-parameter measurement device 5 is N(N−1)/2 or 4(4−1)/2=6 full calibrations. However, in accordance with embodiments of the present invention, the number of full two-port calibrations required to characterize the S-parameter measurement device is reduced to M/2 or 2/2=1 full two-port calibration.

Figure 2:
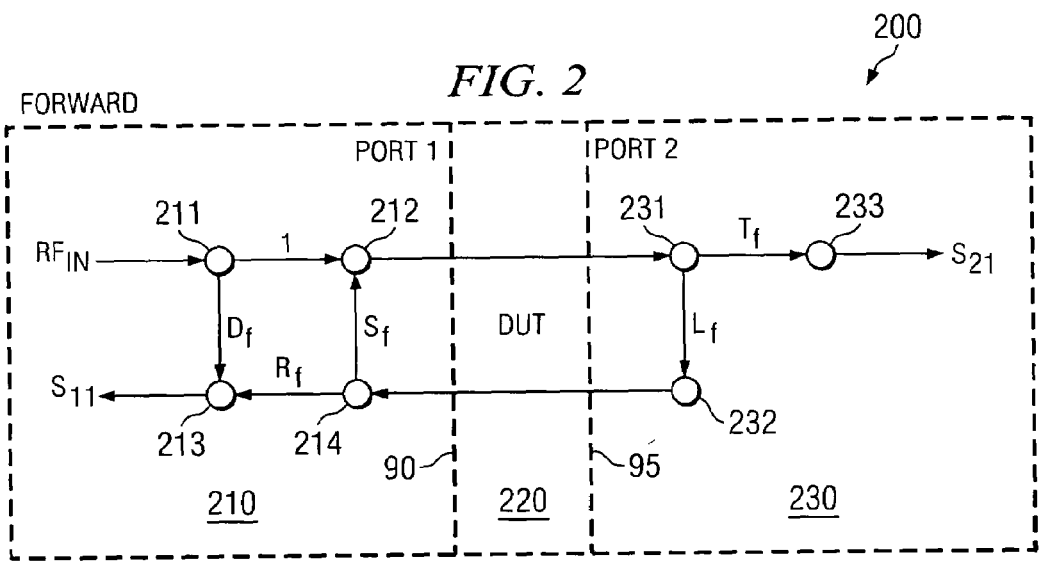
FIG. 2 is a flow diagram of the forward 10-term S-parameter error model of a two-port network analyzer.
Figure 3:
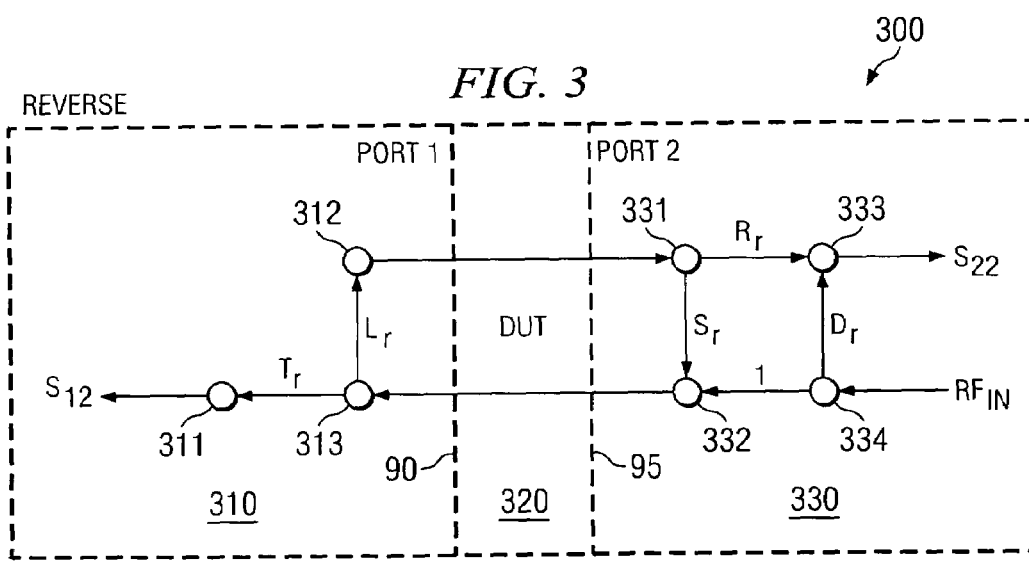
FIG. 3 is a flow diagram of the reverse 10-term S-parameter error model of a two-port network analyzer.

FIG. 2 is a flow diagram of the forward 10-term S-parameter error model of a two-port network analyzer and FIG. 3 is the same for the reverse error model. Each path through the network analyzer corresponding to a pair of ports is characterized by two 10-term error models, one model for each of the two signal flow directions (forward and reverse). The 10-term error model discussed herein is equivalent to the standard 12-term error model when ignoring the crosstalk terms. It should be appreciated that the crosstalk terms can be corrected separately using standard methods known in the art, in accordance with the principles of the present invention. Although the present invention is described in terms of the 10-term error model, it should be understood that the calibration system and method is applicable to any other type of S-parameter error model. For example, the calibration system and method can be applied to the standard 8-term TRL (thru/reflect/line) error model.

The forward error model 200 shown in FIG. 2 includes an input section 210, a DUT section 220 and an output section 230. The input section 210 is composed of an RF in signal on Port 1 90 of the network analyzer, error terms $D_f$, $R_f$ and $S_f$ coupled between nodes 211, 212, 213 and 214 and a measured S-parameter $S_{11}$. $D_f$ corresponds to the forward directivity error term, $R_f$ corresponds to the forward reflection tracking error term and $S_f$ corresponds to the forward source match error term. The output section 230 is composed of error terms $L_f$ and $T_f$ coupled between nodes 231, 232 and 233 and a measured S-parameter $S_{21}$. $L_f$ corresponds to the forward load match error term and $T_f$ corresponds to the forward transmission tracking error term. The DUT section is composed of the actual S-parameters (not shown) of the DUT. The actual S-parameters of the DUT are equivalent to the measured S-parameters $S_{11}$ and $S_{21}$ with the error terms $D_f$, $R_f$, $S_f$, $L_f$ and $T_f$ removed.

Similarly, the reverse error model 300 shown in FIG. 3 includes in input section 330, a DUT section 320 and an output section 310. The input section 330 is composed of an RF in signal on Port 2 95 of the network analyzer, error terms $R_r$, $D_r$ and $S_r$ coupled between nodes 331, 332, 333 and 334 and a measured S-parameter $S_{22}$. $R_r$ corresponds to the reverse reflection error term, $D_r$ corresponds to the reverse directivity error term and $S_r$ corresponds to the reverse source match error term. The output section 230 is composed of error terms $L_r$ and $T_r$ coupled between nodes 311, 312 and 313 and a measured S-parameter $S_{12}$. $L_r$ corresponds to the reverse load match error term and $T_r$ corresponds to the reverse transmission tracking error term. The DUT section is composed of the actual S-parameters (not shown) of the DUT. The actual S-parameters of the DUT are equivalent to the measured S-parameters $S_{22}$ and $S_{12}$ with the error terms $D_r$, $R_r$, $S_r$, $L_r$ and $T_r$ removed.

The objective of any calibration procedure is to determine the forward and reverse error terms for every transmission path of the DUT at each relevant frequency. As discussed above, traditional calibration methods required a separate full calibration for each transmission path or N(N−1)/2 full calibrations. However, in accordance with embodiments of the present invention, the error terms for all transmission paths can be determined by performing only M/2 full calibrations and partial calibrations on N−M transmission paths with the use of reciprocal networks.

Figure 4A:
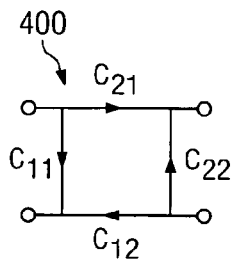
FIGS. 4A–4C are flow diagrams of reciprocal devices, in accordance with embodiments of the present invention.

A two-port reciprocal network is a device in which the forward and reverse transmission S-parameters are equal. Most passive components, such as switches, fall into the class of reciprocal devices. However, some passive components, such as circulators, are not reciprocal. For example, as shown in FIG. 4A, device 400 can be characterized by four S-parameters, illustrated as $C_{11}$, $C_{12}$, $C_{21}$ and $C_{22}$. Device 400 is reciprocal when the two transmission S-parameters, $C_{12}$ ands $C_{21}$, are equal.

Figure 4B:
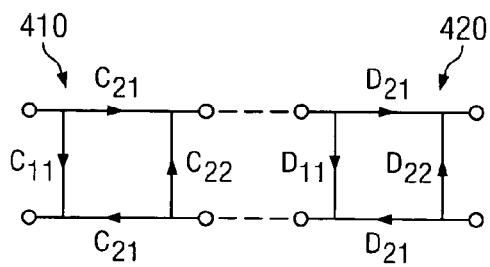

When two reciprocal devices are combined, the result is another reciprocal device. For example, as shown in FIG. 4B, reciprocal device 410 includes reflection S-parameters, illustrated as $C_{11}$, and $C_{22}$, and two equal transmission S-parameters, both illustrated as $C_{21}$. Reciprocal device 420 includes reflection S-parameters, illustrated as $D_{11}$, and $D_{22}$, and two equal transmission S-parameters, both illustrated as $D_{21}$. The combination of reciprocal devices 410 and 420 is reciprocal device 430 that includes reflection S-parameters, illustrated as $E_{11}$, and $E_{22}$, and two equal transmission S-parameters, both illustrated as $E_{21}$.

Figure 4C:
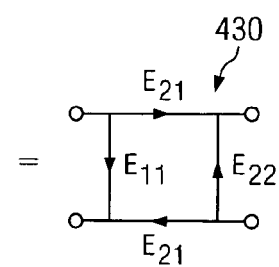
Figure 4C:
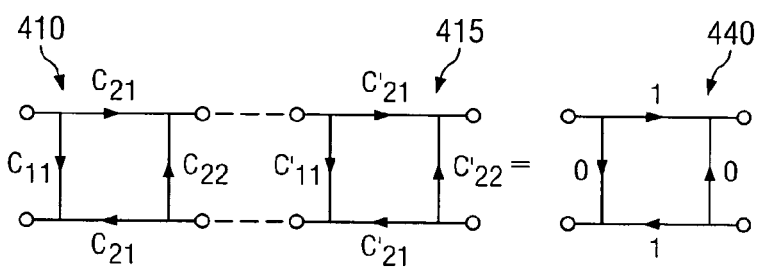

In addition, removing a reciprocal device from a network is equivalent to adding the inverse of the same reciprocal device to the network. For example, as shown in FIG. 4C, reciprocal device 410 includes reflection S-parameters, illustrated as $C_{11}$, and $C_{22}$, and two equal transmission S-parameters, both illustrated as $C_{21}$. The inverse of reciprocal device 410 is also a reciprocal device 415. Reciprocal device 415 includes reflection S-parameters, illustrated as $C'_{11}$, and $C'_{22}$, and two equal transmission S-parameters, both illustrated as $C'_{21}$. When reciprocal device 410 is combined with it's inverse 415, the result is a unity device 440.

Figure 5A:
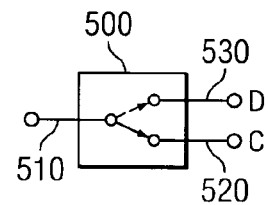
FIG. 5A is a block diagram of a 1×2 RF switch, in accordance with embodiments embodiment of the present invention.

A switch can be characterized as a combination of reciprocal networks. For example, as shown in FIG. 5A, a 1×2 RF switch 500 includes two transmission paths. One transmission path flows between input port A along path 510 and output port C along path 520, and the other transmission path flows between input port A along path 510 and output port D along path 530. Thus, switch 500 is a combination of two reciprocal networks, one for each transmission path 510–520 and 510–530.

Figure 5B:
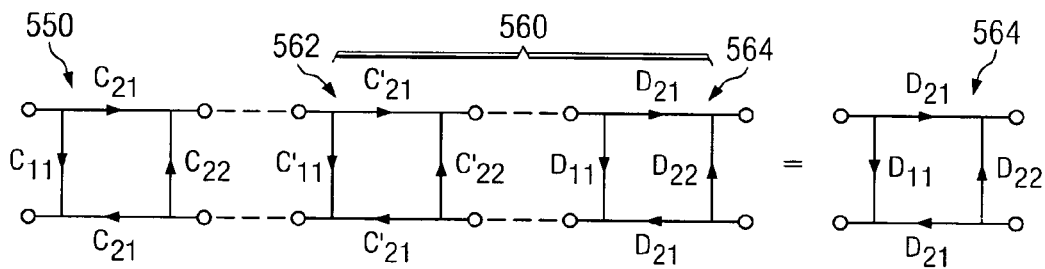
FIG. 5B is a flow diagram of the reciprocal network introduced by switching between ports in the 1×2 switch of FIG. 5A, in accordance with embodiments of the present invention.

When the position of the switch 500 is changed from port C to port D, the system flow diagram changes from the C reciprocal network to the D reciprocal network. This change can be represented mathematically by starting with the C reciprocal network, adding the inverse of the C reciprocal network and adding the D reciprocal network. For example, as shown in FIG. 5B, the C reciprocal network 550 includes reflection S-parameters, illustrated as $C_{11}$, and $C_{22}$, and two equal transmission S-parameters, both illustrated as $C_{21}$. The inverse of the C reciprocal network 562 includes reflection S-parameters, illustrated as $C'_{11}$, and $C'_{22}$, and two equal transmission S-parameters, both illustrated as $C'_{21}$. Likewise, the D reciprocal network 564 includes reflection S-parameters, illustrated as $D_{11}$, and $D_{22}$, and two equal transmission S-parameters, both illustrated as $D_{21}$.

As discussed above in connection with FIG. 4C, when the C reciprocal network 550 is combined with it's inverse reciprocal network 562, the result is a unity network, which is also a reciprocal network. Combining a unity reciprocal network with any other reciprocal network produces the other reciprocal network. Thus, the combination of the unity network with the D reciprocal network 564 is the D reciprocal network 564.

The combination of the inverse C reciprocal network 562 and the D reciprocal network 564 represents an RF switch error, which is also a reciprocal network 560. The RF switch error is the error introduced when the RF switch 500 (shown in FIG. 5A) switches between ports C and D. The RF switch error includes all of the error terms describing the switch error. Since the RF switch error can be characterized as a reciprocal network 560, in accordance with embodiments of the present invention, the error introduced by switching between ports can be represented by only three error terms.

Figure 6A:
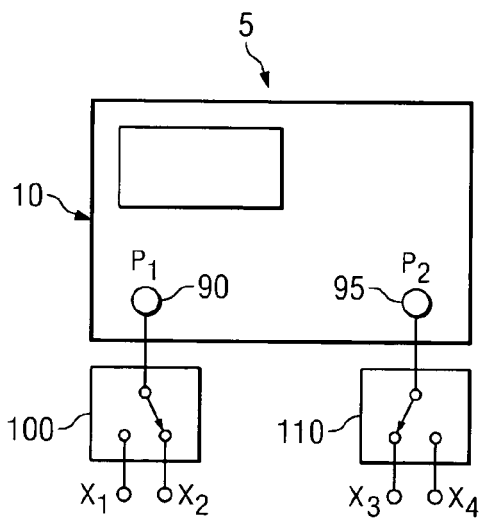
FIG. 6A is a simplified block diagram of an S-parameter measurement device in a first switching position, in accordance with embodiments of the present invention.

To illustrate this concept more completely, reference is made to FIG. 6A, showing a simplified block diagram of an S-parameter measurement device 5 in a first switching position. The S-parameter measurement device 5 includes a network analyzer 10 having ports P1 90 and P2 95. Network analyzer 10 is connected to two 1×2 RF switches 100 and 110, each having two ports, illustrated as X1, X2, X3 and X4. Switch ports X1 and X2 are coupled to network port P1 90 via switch 100 and switch ports X3 and X4 are coupled to network port P2 95 via switch 110. In the first switching position, switch 100 is set to switch port X2, providing a transmission path from port P1 90 to switch port X2, and switch 110 is set to switch port X3, providing a transmission path from port P2 95 to switch port X3.

In the first switching position, a full two-port calibration can be performed between switch port pair X2 and X3, as understood in the art. For example, the full calibration can be done according to any calibration technique, such as SOLT (Short, Open, Load, Through), LRM (Line, Reflect, Match), TRL (Through, Reflect, Line) or any other suitable combination of calibration standards to determine the calibration array for the transmission path between Port 1 90, switch port X2, switch port X3 and Port 2 95. In one embodiment, the calibration array includes the ten error terms in the forward direction and the ten error terms in the reverse direction at each relevant frequency that characterize the error in the transmission path.

Figure 6B:
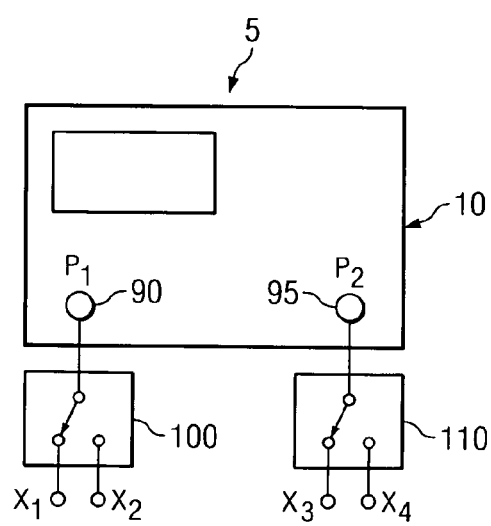
FIG. 6B is a simplified block diagram of an S-parameter measurement device in a second switching position, in accordance with embodiments of the present invention.

When the S-parameter measurement device 5 is changed to a second switching position, as shown in FIG. 6B, an RF switch error is introduced. For example, in FIG. 6B, in the second switching position, switch 100 is changed from switch port X2 to switch port X1. The RF switch error is attributable to the reciprocal network introduced by changing the position of switch 100 from switch port X2 to switch port X1. Therefore, the two-port calibration between switch ports X2 and X3 is equivalent to the two-port calibration between switch ports X1 and X3 combined with a reciprocal network representing the RF switch changing from switch port X2 to switch port X1.

Figure 7:
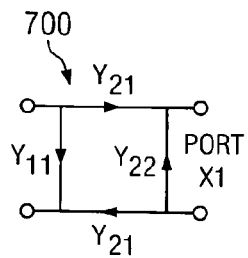
FIG. 7 is a flow diagram illustrating the switch error terms attributable to the reciprocal network introduced by the second switching position of FIG. 6B, in accordance with embodiments of the present invention.
Figure 8:
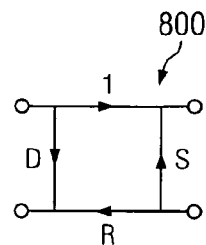
FIG. 8 is a flow diagram illustrating the relationship between error terms measured using open, short and load standards and the switch error terms, in accordance with one embodiment of the present invention.

In FIG. 7, the RF switch error is characterized in signal flow diagram format as a reciprocal network 700 including three switch error terms $Y_{11}$, $Y_{22}$ and $Y_{21}$. Switch error terms $Y_{11}$ and $Y_{22}$ represent the reflection errors associated with changing the RF switch to a switch port at which a full calibration was not performed and $Y_{21}$ represents the transmission error of the RF switch position change. The three error terms introduced by the RF switch position change can be determined by a variety of methods. For example, in one embodiment, as shown in the flow diagram of FIG. 8, the three switch error terms $Y_{11}$, $Y_{22}$ and $Y_{21}$ are determined using a one-port OSL (Open, Short, Load) method. A known open, short and load are measured at port X1 to calculate the directivity D, source match S and reflection tracking R at port X1, illustrated in signal flow diagram format in network 800. The terms D, S and R are related to the switch error terms $Y_{11}$, $Y_{22}$ and $Y_{21}$ shown in FIG. 7 as follows:

$Y_{11}$=D $Y_{22}$=S; and $Y_{21}$=±SQRT(R).

In another embodiment, the three switch error terms $Y_{11}$, $Y_{22}$ and $Y_{21}$ are determined using a through method. In the through method, a through standard is connected between switch ports X1 and X3, and the RF switch error terms are measured directly, as shown in FIG. 7. However, since a through standard measures both the forward and reverse transmission errors separately, as known in the art, when using a through standard, the RF switch 100 does not need to be reciprocal. For example, if RF switch 100 contains an amplifier or other component that is not reciprocal, the forward and reverse transmission errors are not equal, requiring measurement of both the forward and reverse switch error terms. If RF switch 100 is reciprocal, an over-determined calibration technique can be used to improve the accuracy of the switch error terms $Y_{11}$, $Y_{22}$ and $Y_{21}$, as is understood in the art.

Figure 9A:
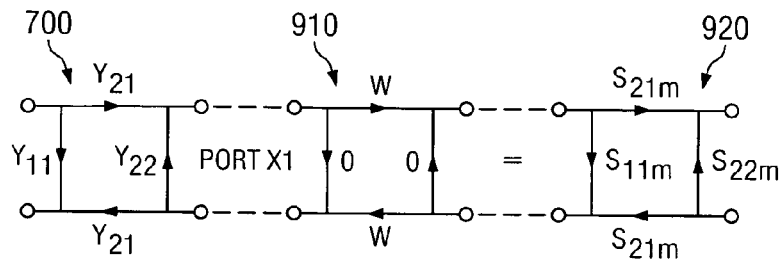
FIGS. 9A and 9B are flow diagrams illustrating the relationship between error terms measured using a reflect standard and a line standard and the switch error terms, in accordance with another embodiment of the present invention.
Figure 9B:
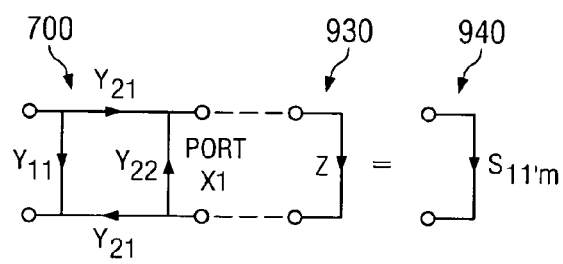

In a further embodiment, as shown in the flow diagrams of FIGS. 9A and 9B, the three switch error terms $Y_{11}$, $Y_{22}$ and $Y_{21}$ are determined using an RL (Reflect, Line) method. In the RL method, a reflect standard is measured on switch port X1 and a line standard is measured between switch ports X1 and X3. Since a line standard is being used, the RF switch (e.g., switch 100) need not be reciprocal for similar reasons as those described above.

As shown in FIG. 9A, a line standard is a reciprocal device that has a good match (i.e., S11=S22=0 and S12=S21). Therefore, reciprocal network 910 for the line standard is represented as "0" on the reflection terms and "W" on the transmission terms. The combination of reciprocal network 700 representing the RF switch error and reciprocal network 910 for the line standard 910 is a reciprocal network 920 for the measured S-parameters $S_{11m}$, $S_{22m}$ and $S_{21m}$ that are measured with the line standard. The measured S-parameters $S_{11m}$, $S_{22m}$ and $S_{21m}$ are related to the switch error terms $Y_{11}$, $Y_{22}$ and $Y_{21}$ as follows:

$S_{11m}=Y_{11}$;

$S_{21m}=Y_{21}*W$; and $S_{22m}=W^2*Y_{22}$.

As shown in FIG. 9B, a reflect standard, such as a known short or open, is measured on switch port X1. It should be understood that if the reflect standard is not known, the reflect standard can be characterized by measuring the reflect standard on switch port X3, which has already been calibrated. The combination of reciprocal network 700 for the RF switch error and network 930 for the reflect standard is network 940 for the measured S-parameter $S_{11'm}$. The measured S-parameter $S_{11'm}$ is related to the switch error terms $Y_{11}$, $Y_{22}$ and $Y_{21}$ as follows:

$S_{11'm}=Y_{11}+Y_{21}\textasciicircum 2*Z/(1-Y_{22}*Z)$.

From the line standard measurements and the reflect standard measurement, the three switch error terms $Y_{11}$, $Y_{22}$ and $Y_{21}$ can be solved for as follows:

$Y_{11}=S_{11m}$;

$Y_{22}=(S_{11'm}-S_{11m})*S_{22m}/(S_{21m}\textasciicircum 2*Z+(S_{11'm}-S_{11m})*S_{22m}*Z)$; and $Y_{21}=\pm SQRT(Y_{22}*S_{21m}\textasciicircum 2/S_{22m})$, where the sign is determined by methods known in the art.

It should be understood that the above calibration methods are merely examples of the types of calibration methods that can be used to determine the RF switch error terms. In other embodiments, the RF switch error terms can be determined using any available calibration method. For example, the RF switch error terms can be determined using a combination of any of the above calibration methods. As another example, the RF switch error terms can be determined using a subset of a TRL-style calibration method between two uncalibrated ports. Even if the network analyzer is not designed to perform TRL calibrations, a TRL-style calibration can be used because there are only six unknown calibration parameters, as opposed to the eight unknown calibration parameters commonly solved for using a TRL calibration. As a further example, the RF switch error terms can be determined using characterized rather than ideal standards.

Once the RF switch error terms are known for each switch port at which a full calibration was not performed, the RF switch error terms are de-embedded from the calibration arrays previously calculated to create calibration arrays for every path in the S-parameter measurement device. As is known in the art, de-embedding is a mathematical procedure for removing the effects of a circuit placed between the calibration plane and the measurement plane from an S-parameter measurement of a device under test (DUT). To remove the effects of the circuit, the S-parameters of the circuit must be known. Typically, the S-parameter matrix of each section (input, DUT and output) are converted to corresponding scattering transfer parameters (T-parameters) matrices, and through matrix operation, the de-embedded circuit characteristic in T-parameters format is calculated. The T-parameters result is converted back to S-parameters. An example of a de-embedding algorithm is described in Agilent Application Note 1364-1 entitled "De-embedding and Embedding S-Parameter Networks Using a Vector Network Analyzer," available from Agilent Technologies, Inc.

Referring to the example shown in FIGS. 6A and 6B, the circuit to be removed is the difference between the RF switch 100 set to X1 and the RF switch 100 set to X2 (hereinafter referred to as the X1/X2 circuit) and the calibration measurement is the calibration array calculated between X2 and X3 (hereinafter referred to as the X2/X3 circuit). The de-embedding process returns a calibration array between ports X1 and X3 calculated using a set of equations that represent the combined errors of the X2/X3 circuit (original calibration array) and the X1/X3 circuit (RF switch error terms). Similar RF switch error determination and de-embedding procedures can be performed to create the calibration arrays between X2 and X4 and X1 and X4.

In one implementation embodiment, the calibration system and method of the present invention can be implemented using one or more electronic calibration (ECal) modules that electronically and automatically calibrate a network analyzer by connecting the ECal modules to the switch ports and pressing a "calibrate" or similar type of button. In another implementation embodiment, the calibration system and method of the present invention can be used with non-insertable switch port connections where a through standard may be difficult to implement. Using an OSL method to determine the three RF switch error terms at some of the ports reduces the number of throughs or lines needed to calibrate the S-parameter measurement device. In a further implementation embodiment, the calibration system and method of the present invention can be used with fixtures where it is difficult to obtain a complete set of standards for calibration. As described above, the calibration system and method of the present invention reduces the number of standards required, thereby simplifying the fixture calibration requirements.

Figure 10:
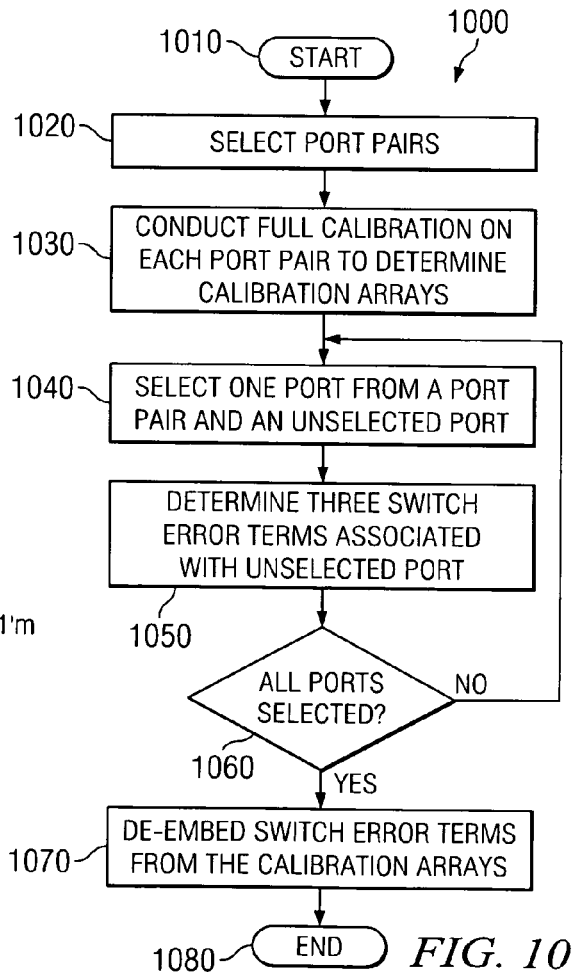
FIG. 10 is a flow chart illustrating an exemplary process for calibrating a multi-port S-parameter measurement device, in accordance with embodiments of the present invention.

FIG. 10 is a flow chart illustrating an exemplary process 1000 for calibrating a multi-port S-parameter measurement device, in accordance with embodiments of the present invention. The multi-port S-parameter measurement device includes a network analyzer having M network ports connected to an RF switch having N switch ports, where N is greater than two. Each of the network ports on the network analyzer is connected to respective sets of the switch ports on the RF switch. The calibration process begins at block 1020. At block 1030, one switch port from each of the sets of switch ports is selected and each selected switch port is assigned to at least one switch port pair. For example, consider the RF switch in FIGS. 6A and 6B that includes two 1×2 RF switches, 100 and 110, each having two ports, where switch 100 includes ports X1 and X and switch 110 includes ports X3 and X4. One switch port from each of the two 1×2 RF switches 100 and 110 is selected (e.g., X1 and X3), and each selected switch port X1 and X3 is assigned to at least one port pair. In this example, port X1 can be selected from switch 100 and port X3 can be selected from switch 110 to form a port pair of X1 and X3.

A full two-port calibration is conducted on each port pair to determine the calibration array (e.g., error models) for each port pair at block 1030. Thus, using the example above, a full two-port calibration is performed between switch ports X1 and X3. At block 1040, a first switch port from one of the port pairs is selected and a second switch port not previously selected to be included in any port pair at block 1020 is selected. The second switch port is within a different set of switch ports than the first switch port. Continuing with the example above, switch port X1 can be selected from the previously selected port pair of X1 and X3 and switch port X4 can be selected, which is within a different set of switch ports (X3 and X4) than X1.

Between the first and second switch ports, a switch error including three switch error terms is determined for the second switch port at block 1050 using any one of the calibration methods described above in connection with FIGS. 8–9B. As explained above, the switch error is attributable to a reciprocal network introduced by the selection of the second port. At block 1060, a determination is made whether each switch port on the RF switch has been selected. If not, blocks 1040 and 1050 are repeated for each previously unselected switch port until all switch ports have been selected and the RF switch error terms for each previously unselected switch port have been determined. Continuing again with the example above, switch port X2 and switch port X3 can be selected to determine the RF switch error terms associated with switch port X2. With the calibration arrays and RF switch error terms determined, at block 1070, the RF switch error terms are de-embedded from the calibration array to create calibration arrays for each forward and reverse path (switch port pair) of the S-parameter measurement device, as described above. The calibration process ends at block 1080.

As will be recognized by those skilled in the art, the innovative concepts described in the present application can be modified and varied over a wide rage of applications. Accordingly, the scope of patents subject matter should not be limited to any of the specific exemplary teachings discussed, but is instead defined by the following claims.

I claim:

1. A method for calibrating a scattering (S) parameter measurement device comprising a network analyzer having M network ports connected to a switch having N switch ports, each of the network ports being connected to respective sets of the switch ports, wherein N is greater than two, the method comprising:
    selecting port pairs by assigning one of the switch ports from each of the sets of switch ports to at least one of the port pairs;
    conducting a full calibration on each of the port pairs to determine calibration arrays for each of the port pairs;
    selecting a first selected one of the switch ports from one of the port pairs and a second selected one of the switch ports from a different one of the sets of switch ports, the second selected port being one of the switch ports not selected during said selecting port pairs step;
    determining a switch error having three switch error terms attributable to a reciprocal network introduced by the selection of the second selected port; and
    de-embedding the switch error from the calibration arrays to construct a complete set of calibration arrays.

2. The method of claim 1, wherein each of the calibration arrays includes error terms of the error model for the respective port pair.

3. The method of claim 2, wherein the error terms include at least eight error terms.

4. The method of claim 3, further comprising:
    determining crosstalk error terms for each of the calibration arrays separately.

5. The method of claim 1, wherein said determining further comprises:
    measuring known open, short and load standards on the second selected port to determine a directivity error term, source match error term and a reflection tracking error term; and
    converting the directivity error term, the source match error term and the reflection tracking error term into the three switch error terms.

6. The method of claim 5, wherein said converting further comprises:
    using the directivity error term as a first one of the three switch error terms;
    using the source match error term as a second one of the three switch error terms; and
    calculating the square root of the reflection tracking term to determine a third one of the three switch error terms.

7. The method of claim 1, wherein said determining further comprises:

measuring a thru standard between the first selected port and the second selected port to determine the three switch error terms.

8. The method of claim 7, wherein said measuring further comprises:

using an over-determined calibration method to determine the three switch error terms.

9. The method of claim 7, wherein the thru standard is a cable and wherein said measuring further comprises:

measuring open, short and load standards on the cable to de-embed the cable.

10. The method of claim 1, wherein said determining further comprises:

measuring a reflect standard on at least the second selected port; and measuring a line standard between the first selected port and the second selected port.

11. The method of claim 10, wherein said measuring the reflect standard further comprises:

measuring the reflect standard on the second selected port and the first selected port.

12. The method of claim 1, wherein said determining further comprises:

measuring a subset of thru, reflect and line (TRL) standards to determine the three switch errors.

13. The method of claim 12, wherein said measuring further comprises:

measuring the subset of TRL standards when the S-parameter measurement device is not designed to perform TRL calibrations.

14. In a calibration system for use with a scattering (S) parameter measurement device comprising a network analyzer having M network ports connected to a switch having N switch ports, each of the network ports being connected to respective sets of the switch ports, wherein N is greater than two, a memory medium comprising software programmed to calibrate the S-parameter measurement device by a method comprising:

conducting a full calibration on one or more port pairs to determine calibration arrays for each of the port pairs, each of the one or more port pairs including one of the switch ports from two different ones of the sets of switch ports;

determining a switch error having three switch error terms attributable to a reciprocal network introduced by an unselected one of the switch ports not included within any of the one or more port pairs; and de-embedding the switch error from the calibration arrays to construct a complete set of calibration arrays.

15. The memory medium of claim 14, wherein each of the calibration arrays includes error terms of the error model for the respective port pair.

16. The memory medium of claim 15, wherein the error terms include at least ten error terms.

17. The memory medium of claim 16, wherein the method further comprises:

determining crosstalk error terms for each of the calibration arrays separately.

18. The memory medium of claim 14, wherein said determining further comprises:

measuring known open, short and load standards on the unselected port to determine a directivity error term, source match error term and a reflection tracking error term; and converting the directivity error term, the source match error term and the reflection tracking error term into the three switch error terms.

19. The memory medium of claim 18, wherein said converting further comprises:

using the directivity error term as a first one of the three switch error terms;

using the source match error term as a second one of the three switch error terms; and calculating the square root of the reflection tracking term to determine a third one of the three switch error terms.

20. The memory medium of claim 14, wherein said determining further comprises:

measuring a thru standard between the unselected port and a selected one of the switch ports from one of the port pairs that is in a different one of the sets of switch ports than the unselected port to determine the three switch error terms.

21. The memory medium of claim 14, wherein said determining further comprises:

measuring a reflect standard on at least the unselected port; and measuring a line standard between a selected one of the switch ports from one of the port pairs and the unselected port.

22. The memory medium of claim 14, wherein said determining further comprises:

measuring a subset of thru, reflect and line (TRL) standards to determine the three switch errors.

23. The memory medium of claim 14, wherein the network analyzer is a vector network analyzer.

24. The memory medium of 14, wherein the memory medium is within the network analyzer.

25. The memory medium of claim 14, wherein the network analyzer is controlled by an external computer system.

26. The memory medium of claim 25, wherein the memory medium is within the computer system.

27. The memory medium of claim 25, wherein the memory medium is a transportable computer-readable medium.

28. The memory medium of claim 14, wherein the network analyzer is a two-port analyzer.

29. The memory medium of claim 28, wherein the switch is a crossbar RF switch.

30. The memory medium of claim 28, wherein the switch includes at least one 1×N RF switch.

31. The memory medium of claim 14, wherein the memory medium is flash ROM, EEPROM or EPROM.

* * * * *